(12) United States Patent
Oshige

(10) Patent No.: US 10,607,886 B2
(45) Date of Patent: Mar. 31, 2020

(54) SEMICONDUCTOR DEVICE WITH CONDUCTIVE MEMBER IN TAPERED THROUGH-HOLE IN SEMICONDUCTOR SUBSTRATE AND METHOD OF MANUFACTURING SEMICONDUCTOR DEVICE

(71) Applicant: CANON KABUSHIKI KAISHA, Tokyo (JP)

(72) Inventor: Hidemasa Oshige, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 163 days.

(21) Appl. No.: 15/664,057

(22) Filed: Jul. 31, 2017

(65) Prior Publication Data

US 2018/0061710 A1 Mar. 1, 2018

(30) Foreign Application Priority Data

Aug. 25, 2016 (JP) .................. 2016-164540

(51) Int. Cl.
*H01L 23/48* (2006.01)
*H01L 21/768* (2006.01)
(Continued)

(52) U.S. Cl.
CPC .... *H01L 21/76898* (2013.01); *H01L 21/3083* (2013.01); *H01L 21/30655* (2013.01);
(Continued)

(58) Field of Classification Search
CPC .......... H01L 21/76898; H01L 21/3083; H01L 21/30655; H01L 23/481; H01L 24/13;
(Continued)

(56) References Cited

U.S. PATENT DOCUMENTS

2009/0200679 A1* 8/2009 Harada ............. H01L 21/76898
257/773
2012/0056291 A1 3/2012 Suzuki et al.
(Continued)

FOREIGN PATENT DOCUMENTS

JP 2012-059881 A 3/2012
JP 2012-164711 A 8/2012
(Continued)

*Primary Examiner* — William F Kraig
(74) *Attorney, Agent, or Firm* — Venable LLP

(57) ABSTRACT

A semiconductor device manufacturing method includes forming a first mask over a semiconductor substrate including a first and second surfaces and an electrode provided on the second surface side, forming a first part having tapered shape by etching the semiconductor substrate with the first mask as a mask, forming a second mask covering a side surface of the first part and exposing the bottom surface of the first part, forming a second part reaching the electrode by etching the semiconductor substrate with the second mask as a mask, forming an insulating film covering the side surfaces of the first and second parts, and forming a conductive member connected to the electrode in the first and second parts. A difference between a maximum width and a minimum width of the second part is smaller than a difference between a maximum width and a minimum width of the first part.

20 Claims, 9 Drawing Sheets

(51) Int. Cl.
  *H01L 21/3065* (2006.01)
  *H01L 21/308* (2006.01)
  *H01L 23/00* (2006.01)
  *H01L 21/311* (2006.01)

(52) U.S. Cl.
  CPC ...... *H01L 21/76831* (2013.01); *H01L 23/481* (2013.01); *H01L 24/13* (2013.01); *H01L 21/31116* (2013.01); *H01L 2224/13025* (2013.01)

(58) Field of Classification Search
  CPC ..... H01L 21/76831; H01L 2224/13025; H01L 21/31116
  See application file for complete search history.

(56) References Cited

U.S. PATENT DOCUMENTS

2014/0312506 A1    10/2014  Hayashi et al.
2016/0268182 A1*   9/2016   Lee ..................... H01L 23/5384

FOREIGN PATENT DOCUMENTS

| | | |
|---|---|---|
| JP | 2014-103210 A | 6/2014 |
| JP | 2015-002299 A | 1/2015 |
| JP | 5810921 B2 | 11/2015 |
| JP | 2016-001759 A | 1/2016 |

* cited by examiner

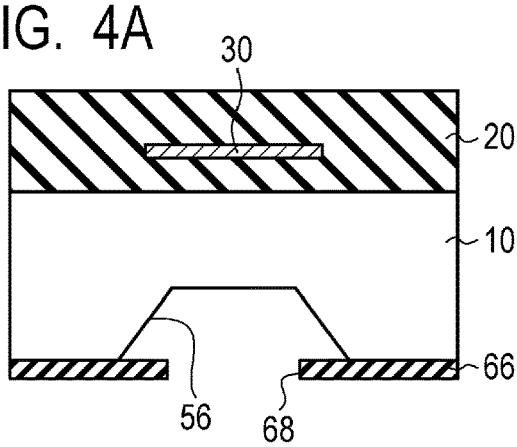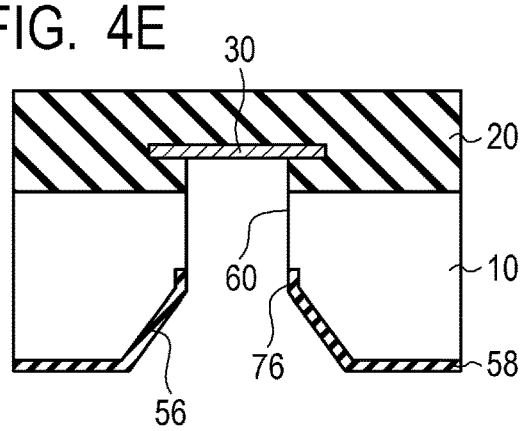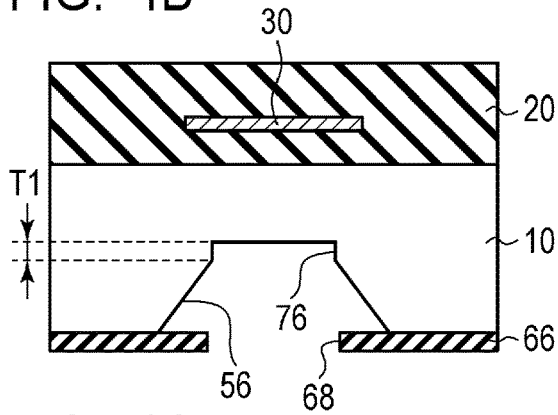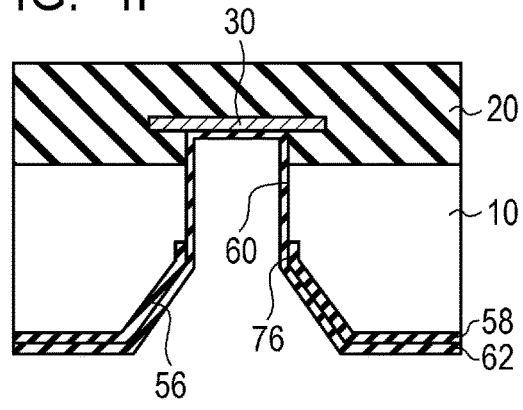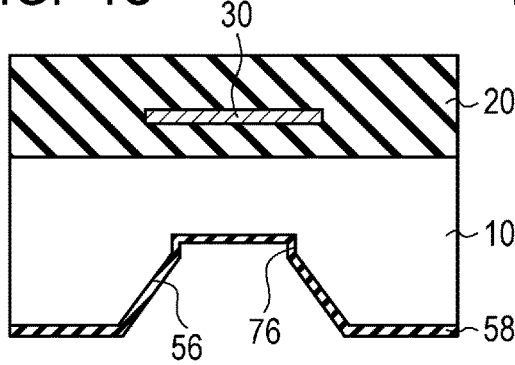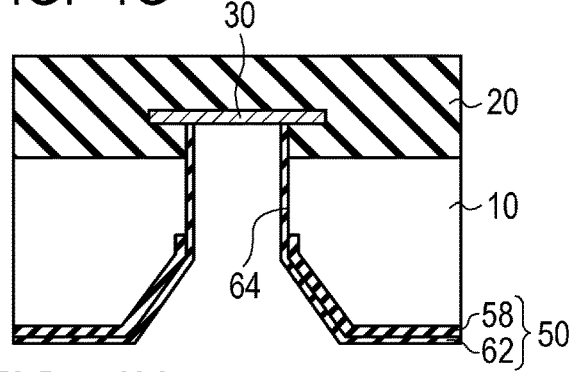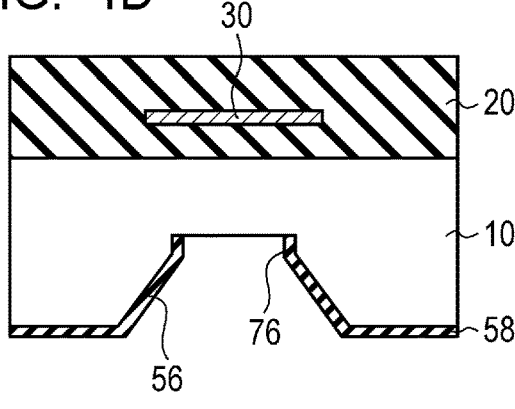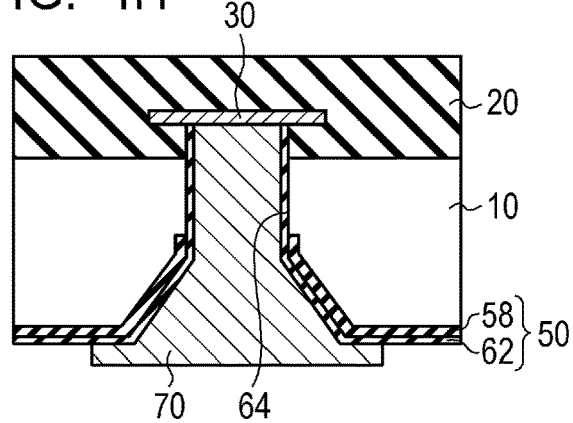

SEMICONDUCTOR DEVICE WITH CONDUCTIVE MEMBER IN TAPERED THROUGH-HOLE IN SEMICONDUCTOR SUBSTRATE AND METHOD OF MANUFACTURING SEMICONDUCTOR DEVICE

BACKGROUND OF THE INVENTION

Field of the Invention

The present invention relates to a semiconductor device and a method of manufacturing the semiconductor device.

Description of the Related Art

A solid-state imaging device or a similar semiconductor device includes a semiconductor substrate on which transistors and other elements, and an interconnection portion connected to the elements, are provided. The interconnection portion includes, among others, an interconnection pattern configured to connect one element to another element, and an interconnection pattern configured to supply power to elements. The semiconductor device further includes an electrode portion configured to connect a part of the interconnection portion to an external device (another semiconductor device, a circuit board, or the like).

When the semiconductor device is connected to an external device by, for example, flip chip bonding, the semiconductor device may be electrically connected to the external device via an electrode that is provided so as to run from the back side of the semiconductor substrate (the side opposite from the front side of the semiconductor substrate where interconnection portion is provided) to the electrode portion. This electrode is formed so as to pass through the semiconductor substrate and is accordingly called a "through electrode." The through electrode is formed by, for example, etching from the back side of the semiconductor substrate to form an opening that passes through the semiconductor substrate and an inter-layer insulating film and that exposes the electrode portion, and then embedding a conductive member in the opening.

In Japanese Patent Application Laid-Open No. 2016-001759, there is proposed the use of an opening having a two-stage configuration that is a combination of a tapered opening and a cylindrical opening, from the viewpoint of facilitating the forming a film of an insulating member used to insulate a wall surface of the opening, and a conductive member embedded in the opening, when a through electrode is formed.

The opening having a two-stage configuration is formed by, as disclosed in Japanese Patent Application Laid-Open No. 2016-001759, a method that uses a single mask pattern to form the tapered opening by isotropic etching, and to subsequently form the cylindrical opening by anisotropic etching.

However, an extensive study conducted on this method by the inventor of the present invention confirmed, for the first time, that a hollow portion shaped like a furrow and running in a depth direction from the boundary between the tapered opening and the cylindrical opening could be formed on a side surface of the opening. The presence of the furrow-like hollow portion on the side surface of the opening lowered the withstand voltage due to insufficient cover provided by the insulating member for insulating the semiconductor substrate from the through electrode and, in some cases, a resultant short circuit brought about a drop in yield and a lessened long-term reliability.

SUMMARY OF THE INVENTION

An object of the present invention is to provide a semiconductor device and a semiconductor device manufacturing method with which the yield and the reliability can be improved by preventing a drop in the performance of insulation between a through electrode and a semiconductor substrate.

According to one aspect of the present invention, there is provided a method of manufacturing a semiconductor device including preparing a semiconductor substrate having a first surface and a second surface opposite from the first surface, the semiconductor substrate being provided with an electrode on a side of the second surface of the semiconductor substrate, forming a first mask over the first surface of the semiconductor substrate, forming, in a region of the semiconductor substrate corresponding to the electrode, a first part of a through-hole having a tapered shape that decreases in width toward a bottom surface thereof by etching the semiconductor substrate with the first mask as a mask, forming a second mask over the semiconductor substrate, the second mask covering at least a side surface of the first part and exposing the bottom surface of the first part, forming a second part of the through-hole communicating with the first part and reaching the electrode by etching the semiconductor substrate with the second mask as a mask, forming an insulating film covering at least the side surface of the first part and a side surface of the second part, and forming a conductive member connected to the electrode in the first part and the second part where the insulating film is formed, wherein a difference between a maximum width of the second part and a minimum width of the second part is smaller than a difference between a maximum width of the first part and a minimum width of the first part.

According to another aspect of the present invention, there is provided a semiconductor device including a semiconductor substrate having a first surface and a second surface opposite from the first surface, the semiconductor substrate being provided with a through-hole passing through the semiconductor substrate from the first surface to the second surface, an electrode placed on a side of the second surface, and a conductive member provided in the through-hole and connected to the electrode, wherein the through-hole includes a first part, which has a tapered shape that decreases in width as a distance from the first surface increases, and a second part, which is located at a point closer to the second surface than the first part, wherein a difference between a maximum width of the second part and a minimum width of the second part is smaller than a difference between a maximum width of the first part and a minimum width of the first part, wherein the semiconductor device is provided with a first insulating film arranged between the conductive member and a side surface of the first part, and between the conductive member and a side surface of the second part, and a second insulating film arranged between the first insulating film and the side surface of the first part, and wherein the second insulating film does not cover at least a portion of the side surface of the second part.

Further features of the present invention will become apparent from the following description of exemplary embodiments with reference to the attached drawings.

BRIEF DESCRIPTION OF THE DRAWINGS

FIG. 4A, FIG. 4B, FIG. 4C, FIG. 4D, FIG. 4E, FIG. 4F, FIG. 4G, and FIG. 4H are cross-sectional views for illustrating a method of manufacturing a semiconductor device according to a fourth embodiment of the present invention.

DESCRIPTION OF THE EMBODIMENTS

Preferred embodiments of the present invention will now be described in detail in accordance with the accompanying drawings.

First Embodiment

Figure 1:
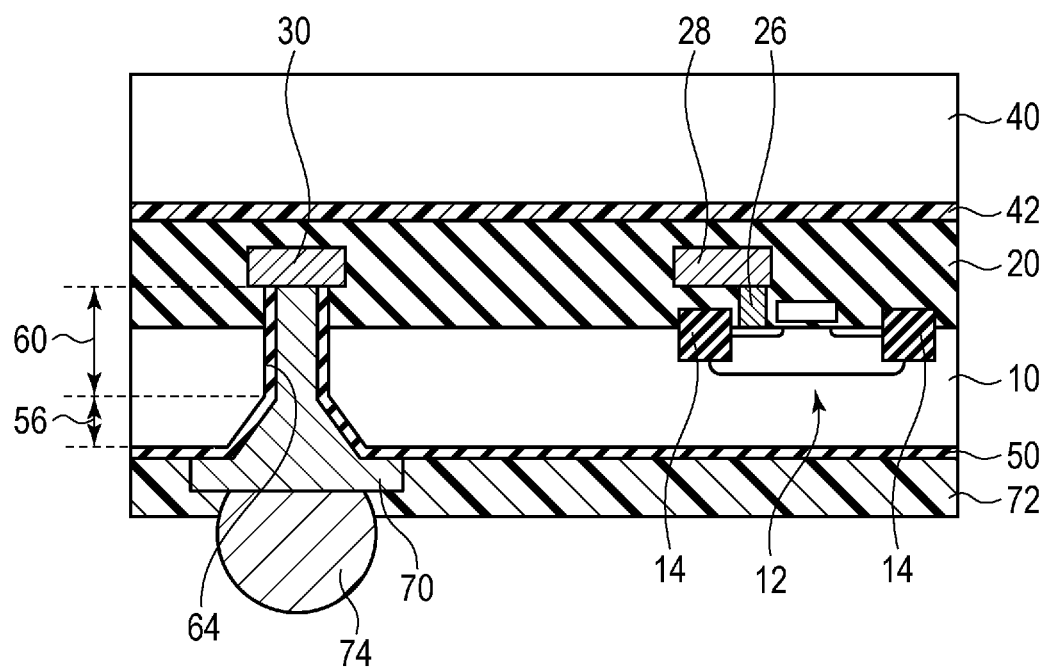
FIG. 1 is a schematic cross-sectional view for illustrating the structure of a semiconductor device according to a first embodiment of the present invention.

A semiconductor device and a method of manufacturing the same according to a first embodiment of the present invention will be described with reference to FIG. 1 and FIG. 2A to FIG. 2L. FIG. 1 is a schematic cross-sectional view for illustrating the structure of the semiconductor device according to the present embodiment. FIG. 2A to FIG. 2L are cross-sectional views for illustrating the method of manufacturing the semiconductor device according to the present embodiment.

The structure of the semiconductor device according to the present embodiment is described first with reference to FIG. 1.

The semiconductor device according to the present embodiment includes a semiconductor substrate 10. A semiconductor element 12 is provided on the front side of the semiconductor substrate 10 (the upper side in FIG. 1). An inter-layer insulating layer 20 is formed on the front side of the semiconductor substrate 10, where the semiconductor element 12 is provided. A contact plug 26 connected to the semiconductor element 12, an interconnection layer 28 connected to the contact plug 26, a pad electrode 30, and others are placed in the inter-layer insulating layer 20. A support substrate 40 is bonded to the top of the inter-layer insulating layer 20 via an adhesive layer 42.

A via-hole 64 reaching the pad electrode 30 is formed in the semiconductor substrate 10 and the inter-layer insulating layer 20 from the back side of the semiconductor substrate 10, which is opposite from the front side. The via-hole 64 is a through-hole that passes through the semiconductor substrate 10 from the substrate's front side to back side. An insulating film 50 is formed on a side surface of the via-hole 64 and the back side of the semiconductor substrate 10. A through electrode 70 arranged so as to pass through the semiconductor substrate 10 is provided in the via-hole 64 where the insulating film 50 is formed. One end portion of the through electrode 70 is electrically connected to the pad electrode 30, and the other end portion of the through electrode 70 is spread over a part of the insulating film 50 that is located on the back side of the semiconductor substrate 10. A solder ball 74 is provided on the other end portion of the through electrode 70.

The semiconductor substrate 10 is, for example, a silicon substrate. The semiconductor element 12 is an element for implementing a given function of the semiconductor device, and includes a MOS transistor among others. Elements other than the semiconductor element 12, for example, a capacitor and a resistor, may further be provided on the semiconductor substrate 10. The inter-layer insulating layer 20 is formed over the entire surface on the front side of the semiconductor substrate 10 that includes the semiconductor element 12, and is made of an insulating material, for example, silicon oxide or silicon nitride.

The interconnection layer 28 is placed inside the inter-layer insulating layer 20. Although only one interconnection layer 28 is illustrated in FIG. 1, a plurality of interconnection layers may be provided instead. In this case, a via-plug connects one interconnection layer and another interconnection layer to each other. The interconnection layer 28 may be made of copper, aluminum, or a similar metal material. The pad electrode 30 is a lead-out electrode portion connected to a part of an interconnection layer, and may be formed in the same layer as one of the interconnection layers and from the same material that is used to form the interconnection layer. The contact plug 26 may be made of tungsten or a similar metal material. Though not shown, barrier metal made of titanium, tantalum, titanium nitride, tantalum nitride, or the like may further be provided in order to prevent metal that is the constituent of the contact plug 26 from diffusing into the semiconductor substrate 10.

The through electrode 70 extends toward the pad electrode 30, which is formed from the back side of the semiconductor substrate 10 to the front side of the semiconductor substrate 10. The through electrode 70 is formed inside the via-hole 64 having a two-stage shape in which a part 56 has a tapered shape and a part 60 starting at a middle of the semiconductor substrate 10 in depth and ending at the pad electrode 30 has a vertical shape. The part 60 reaches the front side of the semiconductor substrate 10. The part 56 reaches the back side of the semiconductor substrate 10. The part 56 and the part 60 communicate to each other inside the semiconductor substrate 10. The through electrode 70 is formed by embedding a conductive member inside the part 56 and the part 60. Copper, aluminum, or a similar metal material may be used for the conductive member. Barrier metal made of titanium, tantalum, titanium nitride, tantalum nitride, or the like may further be provided in order to prevent the metal material of the conductive member from diffusing into the semiconductor substrate 10.

The expression "vertical shape" is used for the part 60 in order to make the relation to the tapered shape of the part 56 clear, and does not mean a strictly vertical shape. What the description given above means is that the difference between the maximum value and the minimum value in the width of the part 60 is smaller than the difference between the maximum value and the minimum value in the width of the part 56.

The insulating film 50 is placed on the back side of the semiconductor substrate 10, including a side surface of the part 56 and a side surface of the part 60. The insulating film 50 maintains insulation between the through electrode 70 and the semiconductor substrate 10. An insulating material, for example, silicon oxide or silicon nitride, may be used for the insulating film 50.

The drawings of the present application are conceptual views drawn in a manner that is easy to understand the structures of the respective components, and the ratio of the sizes of the components in the drawings does not necessarily match the actual scale of the semiconductor device. For instance, in the actual semiconductor device, the thickness of the semiconductor substrate 10 is several tens microns or more whereas the thickness of the inter-layer insulating layer 20 is about several microns or less.

A method of manufacturing the semiconductor device according to the present embodiment is described next with reference to FIG. 2A to FIG. 2L. The semiconductor device may be manufactured by using a known semiconductor manufacturing process. Steps that are described below may be interspersed with other steps, for example, a heat treatment step and a cleaning step, if necessary, though a description on the inserted steps is omitted here.

Figure 2A:
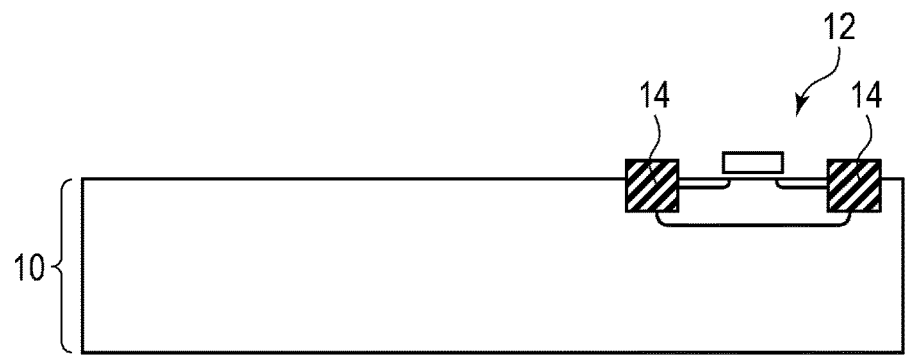
FIG. 2A, FIG. 2B, FIG. 2C, FIG. 2D, FIG. 2E, FIG. 2F, FIG. 2G, FIG. 2H, FIG. 2I, FIG. 2J, FIG. 2K, and FIG. 2L are cross-sectional views for illustrating a method of manufacturing the semiconductor device according to the first and the second embodiments embodiment of the present invention.

First, a given semiconductor element 12 suited to the semiconductor device that is to be manufactured is formed on the front side of the semiconductor substrate 10, which is one of the surfaces of the semiconductor substrate 10 (FIG. 2A). An element isolation portion 14 may be formed on the semiconductor substrate 10 by shallow trench isolation (STI) or other methods. The element isolation portion 14 may electrically isolate one semiconductor element 12 from its adjacent semiconductor element 12. A MOS transistor is illustrated in FIG. 2A as an example of the semiconductor element 12 provided in an active region that is defined by the element isolation portion 14.

Figure 2B:
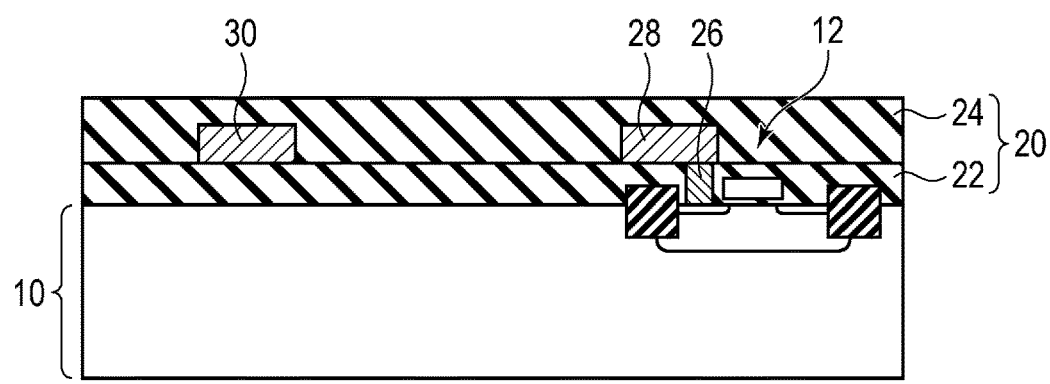

The inter-layer insulating layer 20 and conductive members placed in the inter-layer insulating layer 20, specifically, the contact plug 26, the interconnection layer 28, the pad electrode 30, and others, are formed next on the semiconductor substrate 10 on which the semiconductor element 12 is formed (FIG. 2B). Silicon oxide, silicon nitride, silicon oxynitride, or a similar insulating material may be used for the inter-layer insulating layer 20.

For example, a boro-phospho-silicate glass (BPSG) film is formed by deposition that uses quasi-normal pressure CVD, to form an insulating film 22 from the BPSG film. The contact plug 26 electrically connected to the semiconductor element 12 is formed next inside the insulating film 22. The contact plug 26 may be formed by embedding tungsten or other conductive materials in a contact hole that is formed in the insulating film 22. The interconnection layer 28 electrically connected to the contact plug 26 and the pad electrode 30 are formed next on the insulating film 22 in which the contact plug 26 is placed. The interconnection layer 28 and the pad electrode 30 may be formed by forming a conductive film from aluminum or the like by sputtering or other methods, and then patterning the conductive film through dry etching. An insulating film 24 is formed next from a silicon oxide film by deposition that uses plasma CVD on the insulating film 22 where the interconnection layer 28 and the pad electrode 30 are placed. The inter-layer insulating layer 20 in which the contact plug 26, the interconnection layer 28, and the pad electrode 30 are placed is formed from the insulating films 22 and 24 in this manner.

Figure 2C:
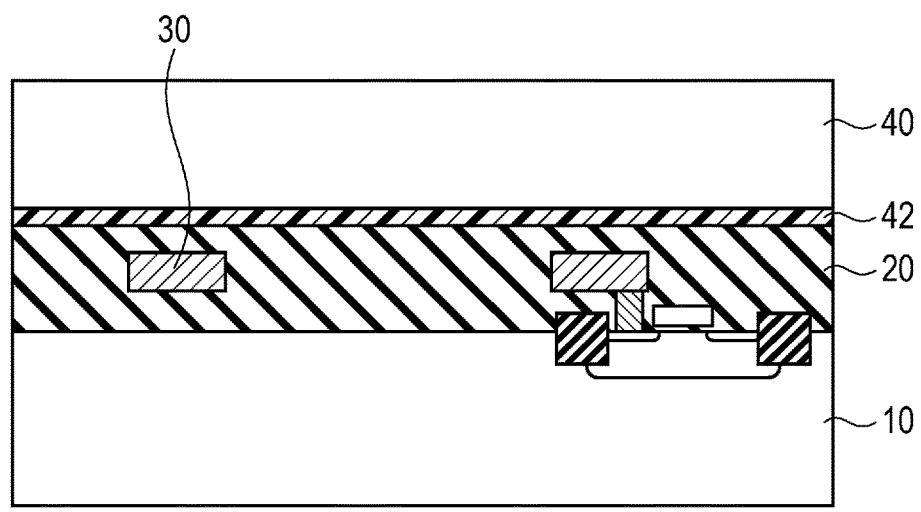

Next, the support substrate 40 is bonded via the adhesive layer 42 to the front side of the semiconductor substrate 10 on which the semiconductor element 12, the inter-layer insulating layer 20, and others have been formed (FIG. 2C). There is no particular limitation to the support substrate 40. Here, a quartz glass substrate having a thickness of 0.5 mm is used as the support substrate 40.

Figure 2D:
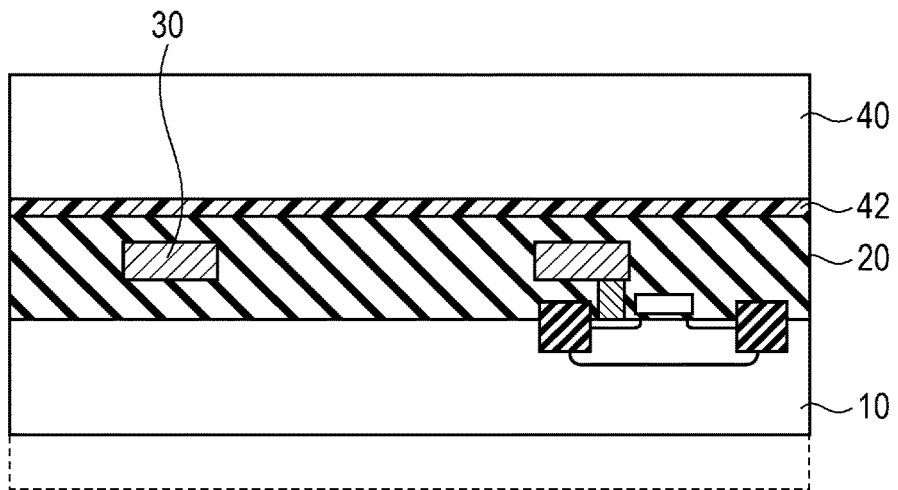

Next, back grinding is performed, if necessary, from the back side of the semiconductor substrate 10, which is a surface opposite from the front side, to make the semiconductor substrate 10 thinner (FIG. 2D). The semiconductor substrate 10 is thinned by back grinding to a thickness of, for example, 0.2 mm or so.

A mask film 52 is formed next on the back side of the semiconductor substrate 10 from a silicon oxide film formed by deposition that uses, for example, plasma CVD to a thickness of from about 0.6 µm to about 2.4 µm, for example, 1.2 µm. The mask film 52 is at least thick enough to avoid being etched off completely in etching described later that is used to form the part 56.

The mask film 52 is patterned next by photolithography and dry etching to form an opening 54 in a region where the through electrode 70 connected to the pad electrode 30 is to be formed. The mask film 52 made of silicon oxide may be etched by, for example, capacitive coupling reactive ion etching (RIE) that uses mixture gas of $CF_4$, $C_4F_8$, and $O_2$ as etching gas.

Figure 2E:
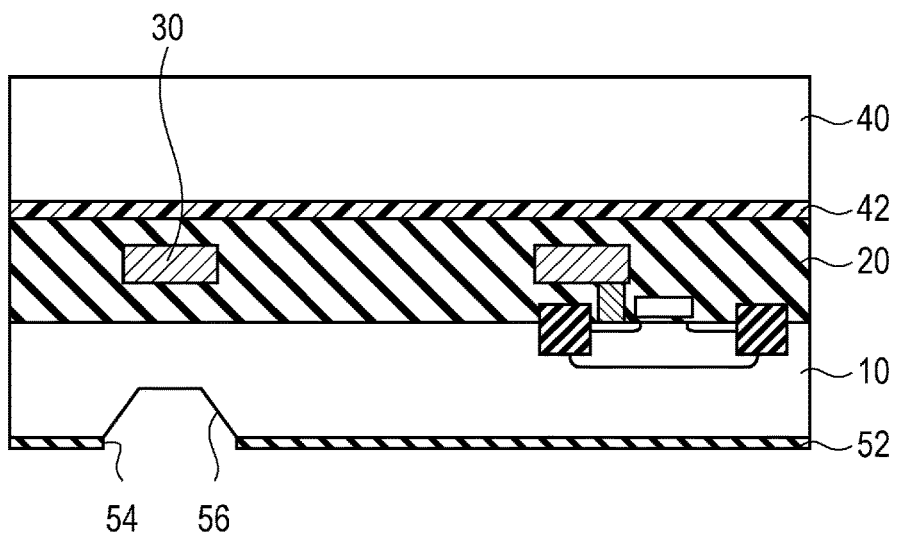

With the patterned mask film 52 as a mask, a region of the semiconductor substrate 10 that is inside the opening 54 is etched next to form the part 56 in the semiconductor substrate 10 (FIG. 2E). The part 56 is formed so as to have a tapered shape that decreases in width toward its bottom. The tapered part 56 may be formed by, for example, inductive coupling RIE that uses mixture gas of $SF_6$, $C_4F_8$, and $O_2$ as etching gas. The etched amount of the semiconductor substrate 10 is adjusted appropriately so that the bottom of the part 56 is positioned at a middle of the semiconductor substrate 10 in depth. The part 56 formed here as an example has the bottom at a depth of 90 µm in the semiconductor substrate 10 that is 200 µm in thickness. The tapered shape of the part 56 in terms of depth, taper angle, and the like is set appropriately to suit the deposition condition of a seed metal layer, in a manner that prevents discontinuity in the seed metal layer when the through electrode 70 is formed.

While an example in which a photoresist pattern formed by photolithography is transferred onto the mask film 52 to be used as a mask for forming the part 56 is described in the present embodiment, a photoresist film formed by photolithography may be used as a mask film. However, forming a mask film from an inorganic insulating material as in the present embodiment is favorable because the mask film does not need to be removed in a later step and the retained mask film may be used as an insulating film for insulation between the through electrode 70 and the semiconductor substrate 10 after the semiconductor device is completed. In the case where a photoresist film is used as the mask film 52 and an inorganic insulating material is used for a mask film 58, which is described later, the mask film 52 is removed after the etching that is executed to form the part 56.

Figure 2F:
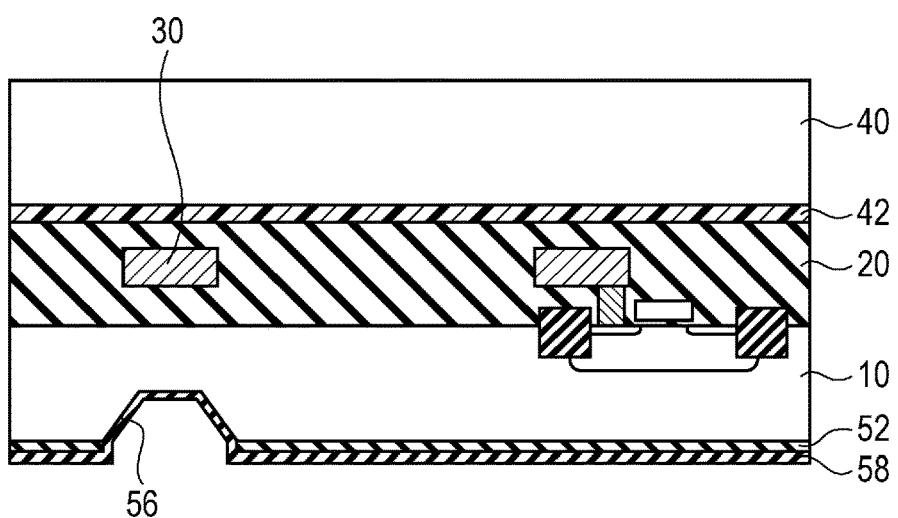

Next, the mask film 58 is formed on the back side of the semiconductor substrate 10, including the side surface and bottom surface of the part 56, from a silicon oxide film formed by deposition that uses, for example, plasma CVD to a thickness of from about 1.0 µm to about 4.0 µm, for example, 2.0 µm (FIG. 2F). In the deposition, the amount of raw material gas supplied becomes smaller as the distance from the mouth of the part 56 increases, which means that a part of the mask film 58 that is formed inside the part 56 is thinner than a part of the mask film 58 that is formed on the mask film 52. For instance, in one example, when a superficial part of the mask film 58 that is on the mask film 52 has a thickness of 2.0 µm, a part of the mask film 58 that is on the bottom surface of the part 56 has a thickness of 1.2 µm, which is approximately 60% of the thickness of the superficial part of the mask film 58.

Figure 2G:
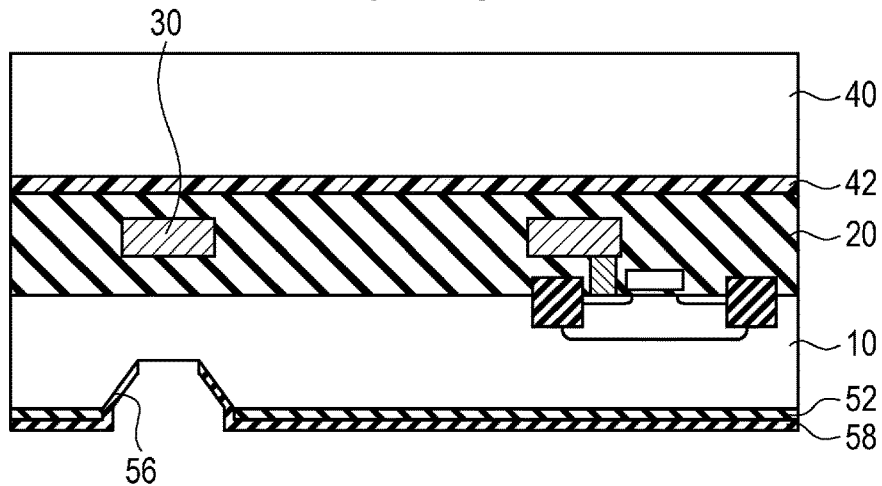

Next, the mask film 58 is etched back to selectively remove a part of the mask film 58 that is on the bottom surface of the part 56 (FIG. 2G). The mask film 58 is, as described above, thinner in a part that is on the bottom surface of the part 56 than in the superficial part that is on the mask film 52. This difference in film thickness may be utilized to selectively remove the part of the mask film 58 that is on the bottom surface of the part 56. The mask film 58 made of silicon oxide may be etched by, for example, capacitive coupling RIE that uses mixture gas of $CF_4$, $C_4F_8$, $O_2$, and Ar as etching gas.

For example, etching the silicon oxide film by about 1.4 µm leaves approximately 0.6 µm of the superficial part of the mask film 58 that is on the mask film 52 and approximately 0.4 µm of the part of the mask film 58 that is on the side surface of the part 56 while removing the mask film 58 from the bottom surface of the part 56. As a result, the side surface of the part 56 and the mask film 52 are covered with the mask film 58, with the back side of the semiconductor substrate 10 exposed only at the bottom of the part 56.

Figure 2H:
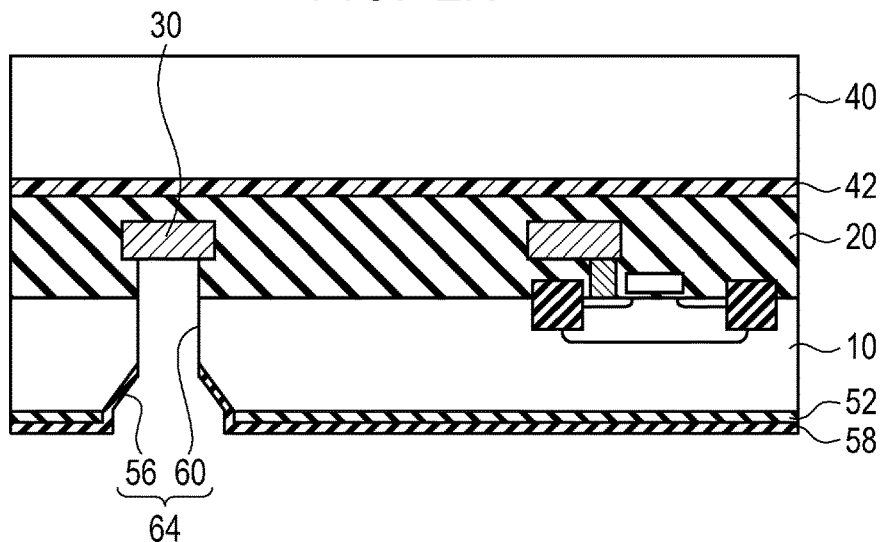

Next, the part 60 communicating with the part 56 and reaching the pad electrode 30 is formed by etching the semiconductor substrate 10 and the inter-layer insulating layer 20 from the back side, with the mask film 58 as a mask. The via-hole 64, which is made up of the parts 56 and 60 and which passes through the semiconductor substrate 10 and the inter-layer insulating layer 20 from the back side to reach the pad electrode 30, is thus formed (FIG. 2H).

The part 60 is formed by anisotropic etching so as to have a vertical shape with a substantially constant width along a direction that runs toward the deeper part of the semiconductor substrate 10 (along a normal direction). The semiconductor substrate 10 that is thick and exceeds 100 µm may be etched by, for example, what is called Bosch process. The inter-layer insulating layer 20 may be etched by, for example, capacitive coupling RIE that uses mixture gas of $CF_4$, $C_4F_8$, $O_2$, and Ar as etching gas.

The Bosch process is a method that has three steps, namely, (1) an isotropic etching step, (2) a protective film forming step, and (3) a step of removing the protective film from a via bottom surface, as one cycle, and that repeats the cycle by executing each step for a short time and quickly switching from one step to another. In the isotropic etching step, $SF_6$ or similar gas is used and the etching is performed with mainly a radical as a reactive species. When this step is performed for a long time, too much side etching is caused, and the isotropic etching step is therefore switched to the protective film forming step after a short time (about several seconds). In the protective film forming step, $C_4F_8$ or similar gas is decomposed in plasma to form a CF polymer film by deposition. The protective film forming step also is switched to the next step after as short a time as several seconds. In the step of removing the protective film from a via bottom surface, $SF_6$ or similar gas is used and a relatively high bias power is applied to the stage side where the semiconductor substrate 10 is set. The bias power application causes anisotropic ions to enter the semiconductor substrate 10, thereby removing the protective film from the bottom surface of the via. In the bias power application, substantially no ions enter a side surface portion of the via, and the protective film is consequently not removed from the side surface of the via. The side surface portion is protected by the protective film from the etching in the isotropic etching step of the next cycle, and the etching progresses only on the bottom surface of the part 60. Through repetition of this cycle, the etching may be advanced little by little vertically in a depth direction of the semiconductor substrate 10.

With the part 56 tapered, ions also enter a tapered surface that is the side surface of the part 56 in the protective film removing step when the part 60 is formed vertically by the Bosch process. The furrow-like hollow portion described above is caused as a result of etching a part of the semiconductor substrate 10 that is exposed on the tapered surface in the depth direction. However, in the present embodiment, where the mask film 58 is formed on the tapered surface of the part 56, the furrow-like hollow portion caused by etching the tapered surface of the part 56 may be prevented.

Figure 2I:
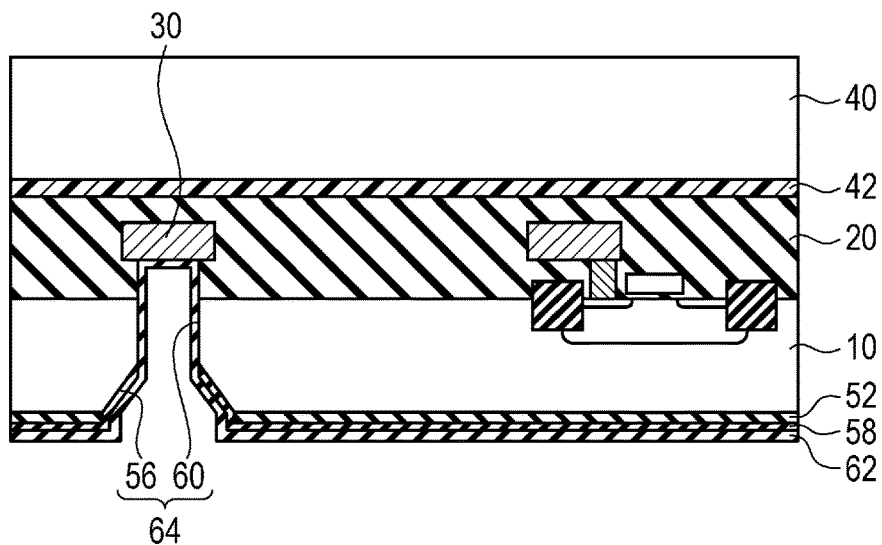

An insulating film 62 is formed next on the back side of the semiconductor substrate 10, including the side surface and bottom surface of the via-hole 64 (the bottom surface is the exposed surface of the pad electrode 30) (FIG. 2I). Silicon oxide, silicon nitride, or other insulating materials may be used for the insulating film 62. The insulating film 62 is formed from, for example, a silicon oxide film formed by deposition that uses, for example, plasma CVD to a thickness of from about 0.7 µm to about 3.0 µm, for example, 1.5 µm. In the present embodiment where the generation of a furrow-like hollow portion in the via-hole 64 is prevented, the cover provided by the insulating film 62 is improved.

The amount of raw material gas that is supplied when the insulating film 62 is formed becomes smaller as the distance from the mouth of the part 60 increases. A part of the insulating film 62 that is formed in the via-hole 64 is accordingly thinner than a superficial part of the insulating film 62 that is formed on the mask film 58. For instance, in one example, when the superficial part of the insulating film 62 that is on the mask film 58 has a thickness of 1.5 µm, a part of the insulating film 62 that is on the tapered surface of the part 56 has a thickness of 1.1 µm, which is approximately 70% of the thickness of the superficial part of the insulating film 62. The thickness of a part of the insulating film 62 that is on the side surface of the part 60 is 0.5 µm, which is approximately 30% of the thickness of the superficial part of the insulating film 62. The thickness of a part of the insulating film 62 that is on the bottom surface of the part 60 (on the pad electrode 30) is 0.6 µm, which is approximately 40% of the thickness of the superficial part of the insulating film 62.

The insulating film 62 is then etched back to selectively remove the insulating film 62 from the bottom surface of the part 60. The insulating film 62 is, as described above, thinner in the part that is on the bottom surface of the part 60 than in the superficial part that is on the mask film 58. This difference in film thickness may be utilized to selectively remove the part of the insulating film 62 that is on the bottom surface of the part 60. The insulating film 62 made of silicon oxide may be etched by, for example, capacitive coupling RIE that uses mixture gas of $CF_4$, $C_4F_8$, $O_2$, and Ar as etching gas.

For example, when the part of the insulating film 62 that is on the pad electrode 30 is 0.6 µm in thickness, the insulating film 62 is etched by about 0.8 µm by taking manufacturing fluctuations into account. This leaves approximately 0.7 µm of the superficial part of the insulating film 62 that is on the mask film 58, approximately 0.2 µm of the part of the insulating film 62 that is on the side surface (tapered surface) of the part 56, and approximately 0.5 µm of the part of the insulating film 62 that is on the side surface of the part 60, while removing the insulating film 62 from above the pad electrode 30.

Figure 2J:
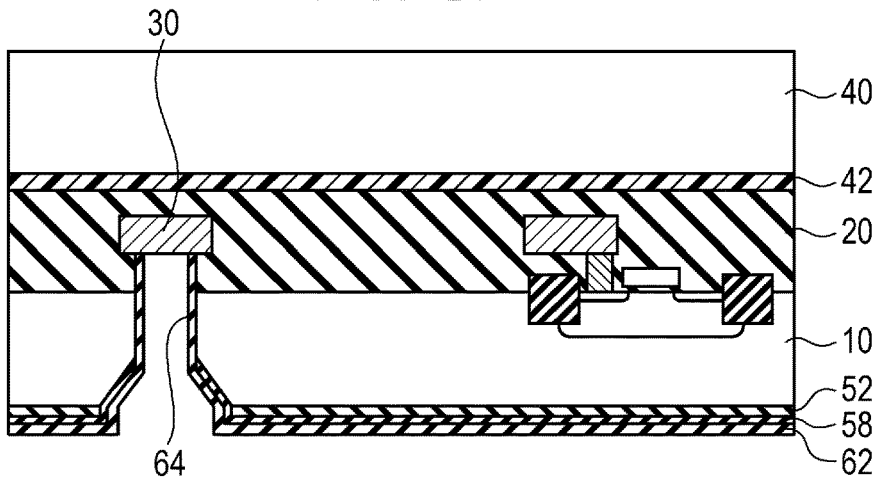

The pad electrode 30 is exposed at the bottom of the via-hole 64 and the side surface of the via-hole 64 is covered with the mask film 58 and the insulating film 62 in this manner (FIG. 2J).

When the part 56 has a tapered shape as in the present embodiment, ions enter the tapered surface as well in the step of etching back the insulating film 62, which means that the part of the insulating film 62 that is on the tapered surface of the part 56 tends to be thin. The thinness may result in small process margin in the etching back step.

In the case where the mask films 52 and 58 are formed from an insulating material as in the present embodiment, however, the mask films 52 and 52 in addition to the insulating film 62 function as the insulating film 50, which provides insulation between the through electrode 70 and the semiconductor substrate 10. In other words, the insulating film 50 includes the mask film 58, which is in contact with the side surface of the part 56, and the insulating film 62, which is in contact with the side surface of the part 60 and which extends over the part of the mask film 58 that is provided on the side surface of the part 56. The mask film 58 and the insulating film 62 extend over the back side of the semiconductor substrate 10 where the mask film 52 is provided.

In the present embodiment, where the insulating mask film 58 remains on the tapered surface of the part 56, insulation is maintained even if the part of the insulating film 62 that is on the tapered surface is lost. In other words, another advantage of the semiconductor device manufacturing method according to the present embodiment is that a wide process margin may be set when the insulating film 62 is etched back.

Figure 2K:
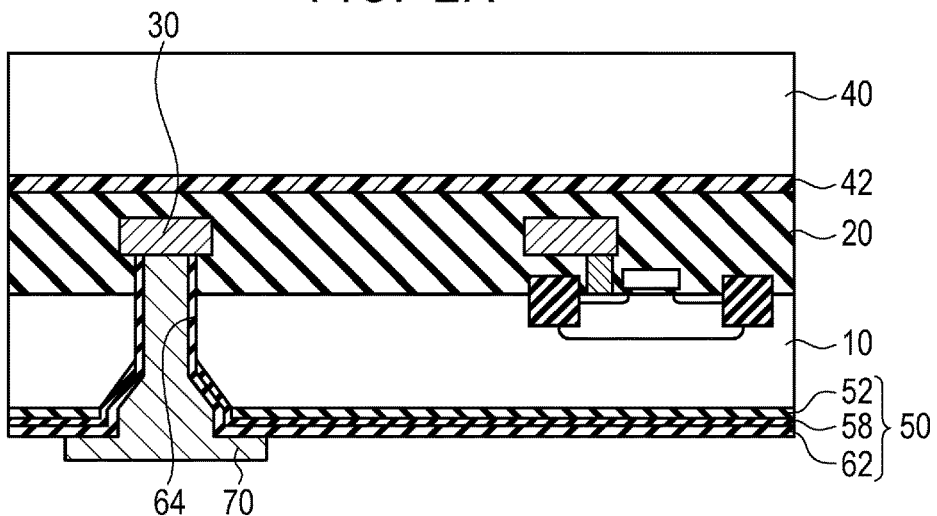

The through electrode 70 is formed next by embedding copper, aluminum, or a similar metal material in the via-hole 64 (FIG. 2K). For example, a metal seed layer (not illustrated) is formed by sputtering from copper, and then a copper film is formed by electrolytic plating, with a photoresist film (not illustrated) that exposes a region where the through electrode 70 is to be formed as a mask. After the photoresist film is removed, an unnecessary part of the metal seed layer is removed, to thereby form the through electrode 70 made of copper. Barrier metal made of titanium, tantalum, titanium nitride, tantalum nitride, or the like may be provided between the insulating film 62 and the through electrode 70 in order to prevent the metal material embedded in the via-hole 64 from diffusing into the semiconductor substrate 10.

According to the present embodiment, where the via-hole 64 has given a tapered shape and the mask film 58 prevents the generation of a furrow-like hollow portion, cover provided by the insulating film 62 may be improved and, combined with the improved cover, discontinuity in the formed metal seed layer may be prevented effectively. Formation of defective interconnection of the through electrode 70 may thus be avoided.

Figure 2L:
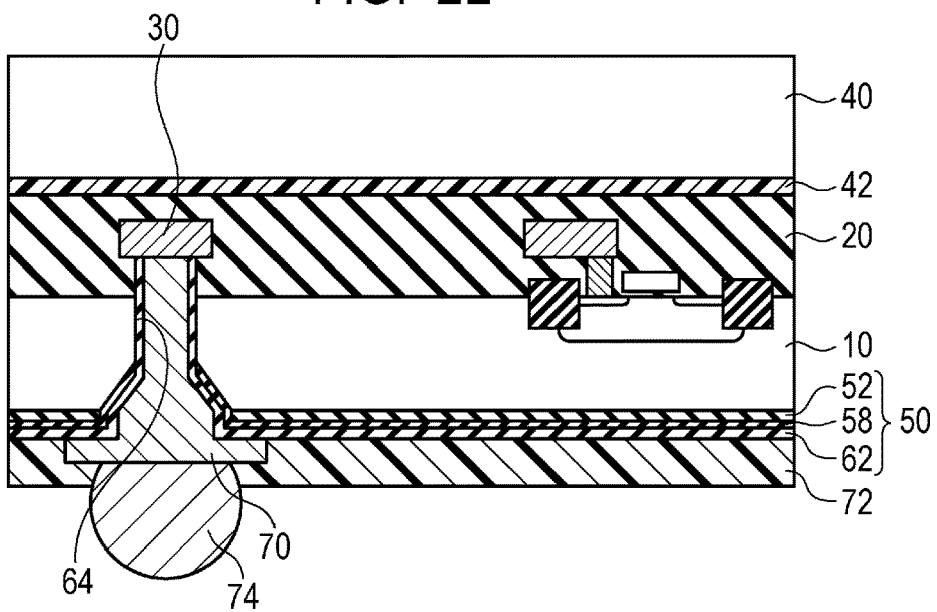

Next, a solder resist 72 is applied to the back side of the semiconductor substrate 10, and the resist film is patterned to form an opening that exposes the through electrode 70. The solder ball 74 is then placed on the exposed through electrode 70 (FIG. 2L). Thereafter, dicing and other steps are performed to complete the semiconductor device according to the present embodiment.

According to the present embodiment, a drop in the performance of insulation between the through electrode and the semiconductor substrate may be prevented, and the resultant semiconductor device is high in yield and long-term reliability.

Second Embodiment

A method of manufacturing a semiconductor device according to a second embodiment of the present invention will be described with reference to FIG. 2A to FIG. 2L. Components that are the same as those in the semiconductor device and the method of manufacturing the same according to the first embodiment are denoted by the same reference symbols, and descriptions of the components are omitted or simplified.

The mask film 58 in the example described in the first embodiment is formed from the same silicon oxide-based insulating film that is used for the inter-layer insulating layer 20. However, the mask film 58 may accidentally be etched, and even lost in some cases, depending on the thickness of a part of the inter-layer insulating layer 20 that is below the pad electrode 30, in the process of forming the part 60 by etching the inter-layer insulating layer 20 until the pad electrode 30 is reached. The loss of the mask film 58 is not particularly a problem in forming the part 60 in the inter-layer insulating layer 20 because the semiconductor substrate 10 functions as an additional mask in the process of etching the inter-layer insulating layer 20. The mask film 58 may be removed when the inter-layer insulating layer 20 is etched.

However, as described in the first embodiment, leaving the mask film 58 on the tapered surface of the part 56 has an advantage in that the process margin may be expanded when the insulating film 62 is etched back. The present embodiment therefore discusses a method in which the loss of the mask film 58 is actively prevented and a process margin is secured when the insulating film 62 is etched back.

The loss of the mask film 58 may be prevented by, for example, a method in which an insulating material different in etching characteristics from the semiconductor substrate 10 and from the inter-layer insulating layer 20, for example, silicon nitride, is used to form the mask film 58.

In the step illustrated in FIG. 2F, the mask film 58 is formed from a silicon nitride film that is formed by deposition that uses, for example, plasma CVD to a thickness of from about 1.0 μm to about 4.0 μm, for example, 2.0 μm. In the deposition, the amount of raw material gas supplied becomes smaller as the distance from the mouth of the part 56 increases, which means that a part of the mask film 58 that is formed inside the part 56 is thinner than a part of the mask film 58 that is formed on the mask film 52. For instance, when a superficial part of the mask film 58 that is on the mask film 52 has a thickness of 2.0 μm, a part of the mask film 58 that is on the bottom surface of the part 56 has a thickness of 1.2 μm, which is approximately 60% of the thickness of the superficial part of the mask film 58.

In the subsequent step illustrated in FIG. 2G, the mask film 58 is etched back to selectively remove the mask film 58 from the bottom surface of the part 56. The mask film 58 made of silicon nitride may be etched by, for example, capacitive coupling RIE that uses mixture gas of $CHF_3$, $CH_2F_2$, $O_2$, and Ar as etching gas. For instance, etching the silicon nitride film by about 1.4 μm leaves approximately 0.6 μm of the superficial part of the mask film 58 that is on the mask film 52 and approximately 0.4 μm of the part of the mask film 58 that is on the side surface of the part 56 while removing the mask film 58 from the bottom surface of the part 56.

In the step illustrated in FIG. 2H, which is the process of etching the inter-layer insulating layer 20, the inter-layer insulating layer 20 is etched under an etching condition that is highly selective of silicon nitride used to form the mask film 58. A case where the part of the inter-layer insulating layer 20 that is below the pad electrode 30 has a thickness of 1.5 μm, and the inter-layer insulating layer 20 is etched by about 1.8 μm in consideration for a process fluctuation of 20% is discussed. In RIE of silicon oxide that uses mixture gas of $C_4F_8$, CO, $O_2$, and Ar as etching gas, the etching selective ratio of silicon oxide to silicon nitride is, for example, 5. When the silicon oxide film is to be etched by about 1.8 μm under this etching condition, the mask film 58 made of silicon oxide is etched by approximately 0.36 μm on the topmost surface. The etching rate on the tapered surface is about 0.6 time of the etching rate on the topmost surface, and the mask film 58 is accordingly etched by approximately 0.22 μm on the tapered surface.

This leaves approximately 0.24 μm of the superficial part of the mask film 58 and approximately 0.18 μm of the part of the mask film 58 that is on the tapered surface after the part 60 is opened. The mask film 58 made of silicon nitride may also be used as an etching stopper in the process of etching back the insulating film 62 made of silicon oxide. In this manner, the process margin may be expanded when the insulating film 62 is etched back.

According to the present embodiment, a drop in the performance of insulation between the through electrode and the semiconductor substrate may be prevented, and the resultant semiconductor device is high in yield and long-term reliability.

Third Embodiment

A semiconductor device and a method of manufacturing the same according to a third embodiment of the present invention will be described with reference to FIG. 3A to FIG. 3F. Components that are the same as those in the semiconductor device and the method of manufacturing the same according to the first and second embodiments are denoted by the same reference symbols, and descriptions of the components are omitted or simplified. FIG. 3A to FIG. 3F are cross-sectional views for illustrating the method of manufacturing the semiconductor device according to the present embodiment.

The present embodiment discusses another method of manufacturing the semiconductor device according to the first embodiment, which is illustrated in FIG. 1.

First, the semiconductor substrate 10 where the semiconductor element 12, the pad electrode 30, and others are formed is thinned by back grinding to a thickness of, for example, 200 μm in the same manner as steps of the semiconductor device manufacturing method according to the first embodiment that are illustrated in FIG. 2A to FIG. 2D.

A mask film 66 having an opening 68 is formed next by photolithography on the back side of the semiconductor substrate 10. The opening 68 is formed in a place where the through electrode 70 connected to the pad electrode 30 is to be formed. The mask film 66 may be formed from a novolak resin-based photoresist to a thickness of from about 1.7 μm to about 7.0 μm, for example, 3.5 μm. The mask film 66 may be formed from the same insulating material that is used for the mask film 52 of the first embodiment.

Figure 3A:
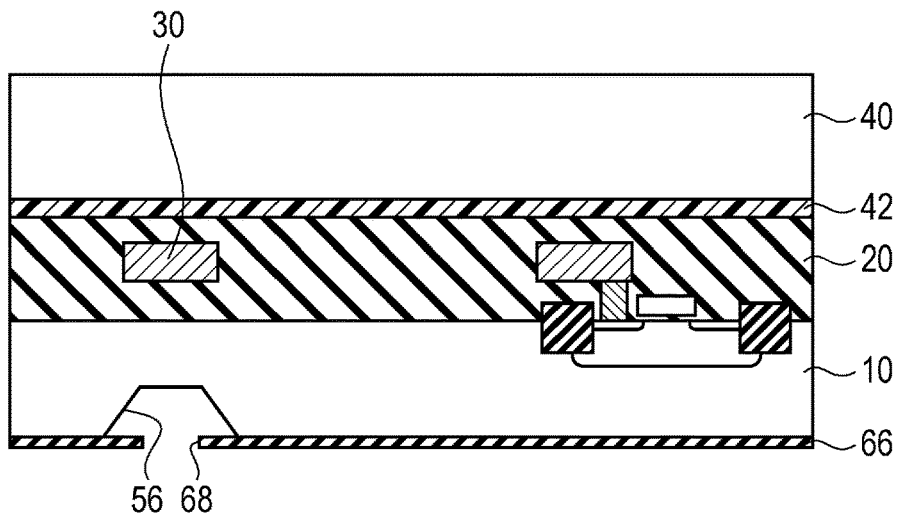
FIG. 3A, FIG. 3B, FIG. 3C, FIG. 3D, FIG. 3E, and FIG. 3F are cross-sectional views for illustrating a method of manufacturing a semiconductor device according to a third embodiment of the present invention.

A part of the semiconductor substrate 10 that is inside the opening 68 is etched next with the mask film 66 as a mask, to form the part 56 in the semiconductor substrate 10 (FIG. 3A). The part 56 is formed so as to have a tapered shape that decreases in width toward its bottom. The tapered part 56 may be formed by, for example, inductive coupling RIE that uses mixture gas of $SF_6$, $C_4F_8$, and $O_2$ as etching gas. The etched amount of the semiconductor substrate 10 is adjusted appropriately so that the bottom of the part 56 is positioned at a middle of the semiconductor substrate 10 in depth. The part 56 in the present embodiment has the bottom at a depth of 90 μm in the semiconductor substrate 10 that is 200 μm in thickness as in the first embodiment.

The present embodiment differs from the first embodiment in that the part 56 having a tapered side surface is formed by etching the semiconductor substrate 10 under an isotropic etching condition that causes the etching to progress in a horizontal direction as well. With the use of the etching condition that causes the etching to progress also in a part of the semiconductor substrate 10 that is covered with the mask film 66, side etching progresses below the mask film 66, with the result that the mask film 66 hangs over the part 56 like eaves. An etching condition that gives the part 56 a tapered side surface inside the opening 54 of the mask film 52 as in the first embodiment is typically an etching condition that is low in etching rate, and takes long to process. The etching time may be cut short by using an isotropic etching condition as the one in the present embodiment. The horizontal direction herein is a direction parallel to the surface of the semiconductor substrate 10.

The mask film 66 is removed next by, for example, ashing. In the case where the mask film 66 is formed from a photoresist and the subsequently formed mask film 58 is formed from an inorganic insulating material as in the present embodiment, the mask film 66 is removed at this point. In the case where the mask film 66 is formed from silicon oxide or other inorganic insulating materials, on the other hand, the mask film 66 does not always need to be removed. However, when the mask film 66 remains and keeps the eaves-like shape illustrated in FIG. 3A, the eaves of the mask film 66 may break off during subsequent steps and become a foreign object, may present difficulties in forming the mask film 58 on the side surface of the part 56, and may cause surface discontinuity in the metal seed layer. It is therefore preferred to remove the mask film 66 at this point.

Figure 3B:
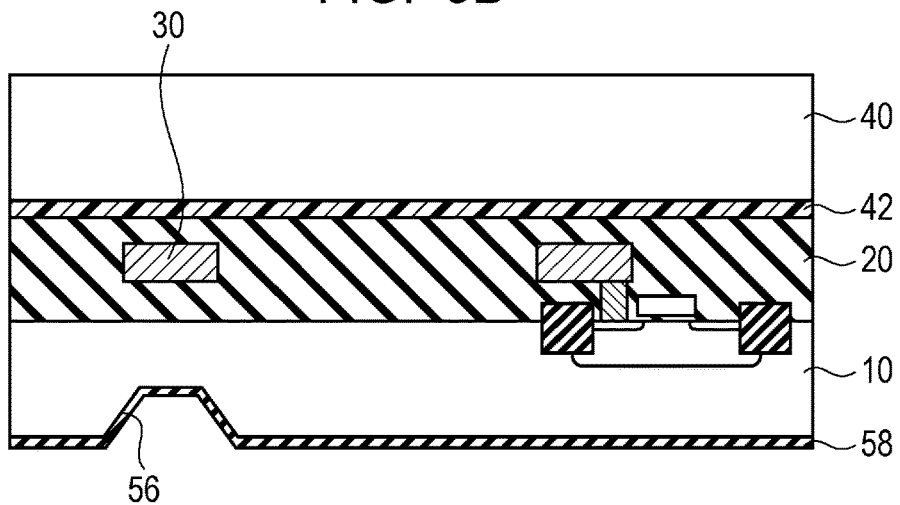

The mask film 58 is formed next from a silicon oxide film on the back side of the semiconductor substrate 10, including the side surface and bottom surface of the part 56, in the same manner as a step of the semiconductor device manufacturing method according to the first embodiment that is illustrated in FIG. 2F (FIG. 3B). The mask film 58 may be formed from an insulating material that has different etching characteristics from those of the semiconductor substrate 10 and the inter-layer insulating layer 20 as described in the second embodiment.

Figure 3C:
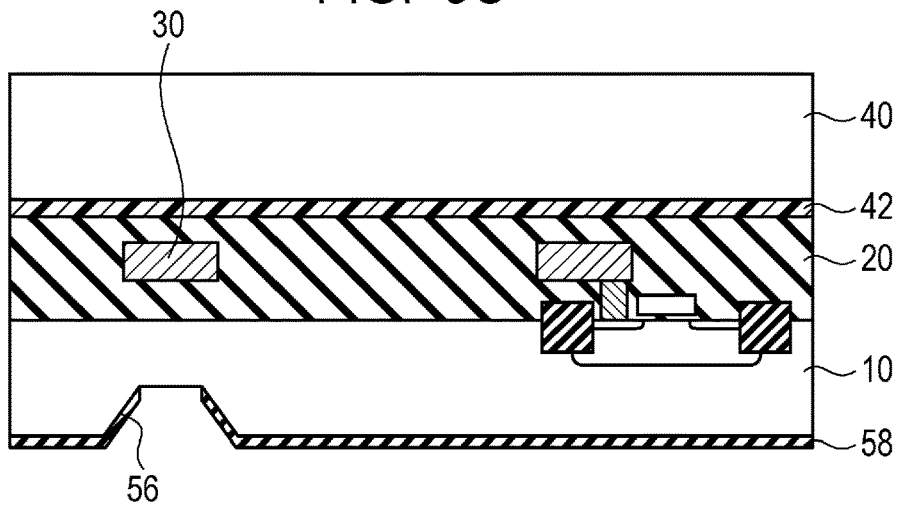

The mask film 58 is etched back in the same manner as a step of the semiconductor device manufacturing method according to the first embodiment that is illustrated in FIG. 2G, to selectively remove the mask film 58 from the bottom surface of the part 56 (FIG. 3C).

Figure 3D:
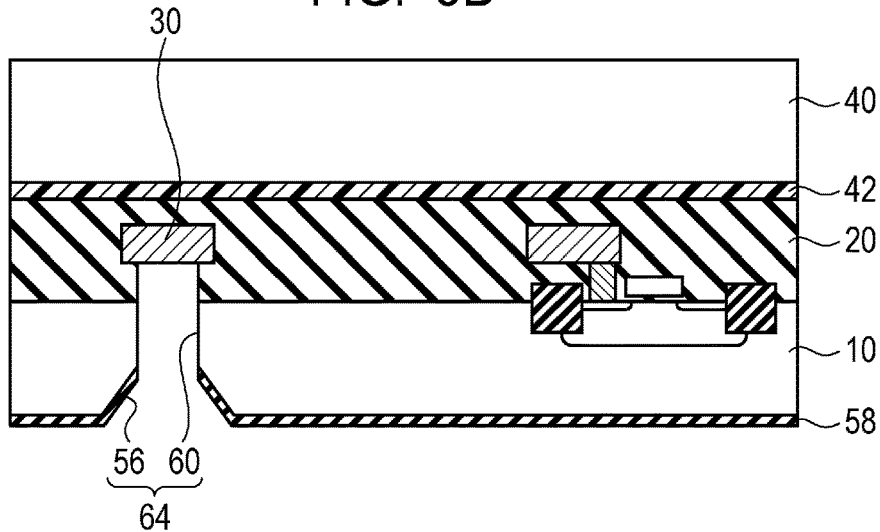

Next, the semiconductor substrate 10 and the inter-layer insulating layer 20 are etched with the mask film 58 as a mask in the same manner as a step of the semiconductor device manufacturing method according to the first embodiment that is illustrated in FIG. 2H, to form the part 60, which reaches the pad electrode 30 (FIG. 3D).

Figure 3E:
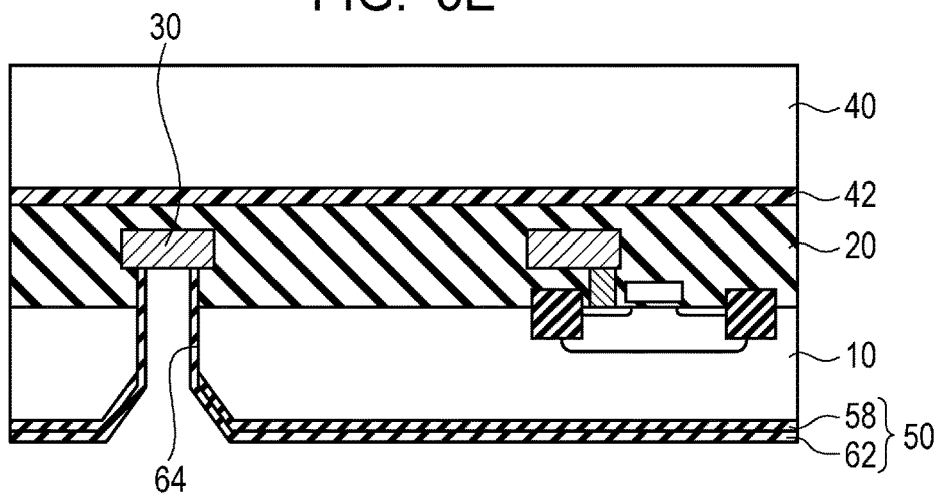

The side surface of the thus formed via-hole 64 is then covered with the mask film 58 and the insulating film 62 in the same manner as steps of the semiconductor device manufacturing method according to the first embodiment that are illustrated in FIG. 2I and FIG. 2J (FIG. 3E).

Figure 3F:
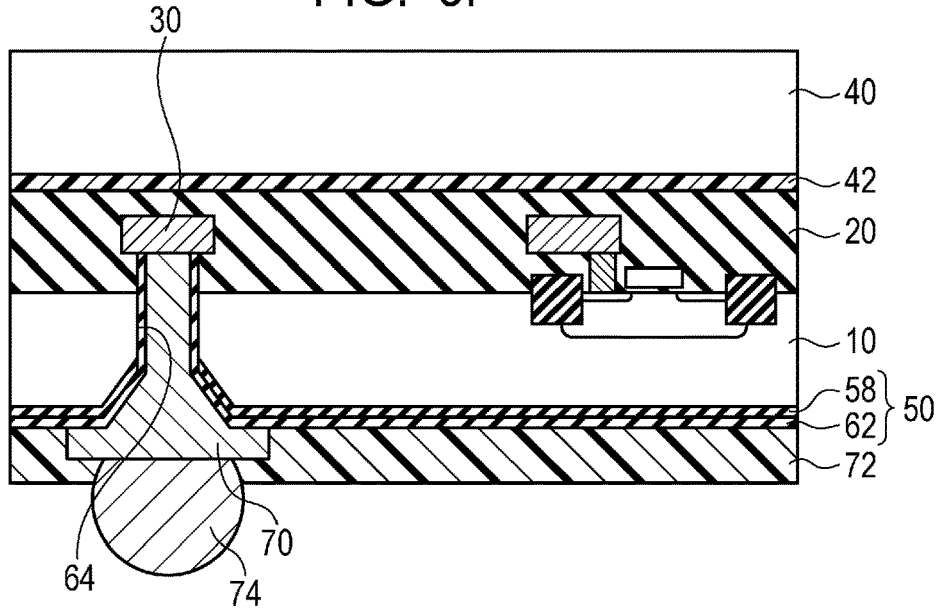

The through electrode 70, the solder resist 72, the solder ball 74, and others are formed next in the same manner as steps of the semiconductor device manufacturing method according to the first embodiment that are illustrated in FIG. 2K and FIG. 2L (FIG. 3F).

According to the present embodiment, a drop in the performance of insulation between the through electrode and the semiconductor substrate may be prevented, and the resultant semiconductor device is high in yield and long-term reliability.

Fourth Embodiment

A semiconductor device and a method of manufacturing the same according to a fourth embodiment of the present invention will be described with reference to FIG. 4A to FIG. 4H and FIG. 5A to FIG. 5F. Components that are the same as those in the semiconductor device and the method of manufacturing the same according to the first to third embodiments are denoted by the same reference symbols, and descriptions of the components are omitted or simplified.

FIG. 4A to FIG. 4H are cross-sectional views for illustrating the method of manufacturing the semiconductor device according to the present embodiment. FIG. 5A to FIG. 5F are views for illustrating effects of the semiconductor device manufacturing method according to the present embodiment. Only a part of the semiconductor device where the through electrode 70 is to be formed is illustrated in FIG. 4A to FIG. 4H. The rest is the same as in the first embodiment, and drawings and descriptions thereof are omitted in the present embodiment.

The mask film 66 and the part 56 are formed first on the back side of the semiconductor substrate 10 in the same manner as a step of the semiconductor device manufacturing method according to the third embodiment that is illustrated in FIG. 3A (FIG. 4A).

A part 76 having a depth T1 is formed next by digging the bottom surface of the part 56 in a vertical direction through anisotropic etching of the semiconductor substrate 10, with the mask film 66 as a mask (FIG. 4B). The part 76 has a side surface formed between the side surface and bottom surface of the part 56, and an inclination angle of the side surface of the part 76 with respect to the surface of the semiconductor substrate 10 is larger than the inclination angle of the side surface of the part 56 with respect to the surface of the semiconductor substrate 10. The width of the part 76 in an example is constant in a depth direction. The preferred depth T1 of the part 76 is 1 µm or more and 10 µm or less. The reason for the preferred depth is described later. The vertical direction herein is a direction parallel to the normal line of the semiconductor substrate 10.

The mask film 66 is removed next by, for example, ashing.

The mask film 58 is formed next from a silicon oxide film that is formed on the back side of the semiconductor substrate 10, including the side surface of the part 56 and the side surface and bottom surface of the part 76, in the same manner as a step of the semiconductor device manufacturing method according to the first embodiment that is illustrated in FIG. 2F (FIG. 4C). A part of the mask film 58 that is formed in the parts 56 and 76 is thinner than the superficial part of the mask film 58 that is formed on the mask film 52. For instance, when a part of the mask film 58 that is formed on a flat part of the semiconductor substrate 10 has a thickness of 2.0 µm, a part of the mask film 58 that is on the bottom surface of the part 76 has a thickness of 1.2 µm, which is approximately 60% of the thickness of the superficial part of the mask film 58.

The mask film 58 is etched back in the same manner as a step of the semiconductor device manufacturing method according to the first embodiment that is illustrated in FIG. 2G, to selectively remove the mask film 58 from the bottom surface of the part 76 (FIG. 4D).

Next, the semiconductor substrate 10 and the inter-layer insulating layer 20 are etched with the mask film 58 as a mask in the same manner as a step of the semiconductor device manufacturing method according to the first embodiment that is illustrated in FIG. 2H, to form the part 60, which reaches the pad electrode 30 (FIG. 4E).

The insulating film 62 is formed next on the back side of the semiconductor substrate 10 in the same manner as a step of the semiconductor device manufacturing method according to the first embodiment that is illustrated in FIG. 2I (FIG. 4F).

Next, the insulating film 62 is etched back in the same manner as a step of the semiconductor device manufacturing method according to the first embodiment that is illustrated in FIG. 2J, to cover the side surface of the via-hole 64 made up of the parts 56 and 60 with the mask film 58 and the insulating film 62 (FIG. 4G).

The through electrode 70 is formed next in the same manner as a step of the semiconductor device manufacturing method according to the first embodiment that is illustrated in FIG. 2K (FIG. 4H).

Figure 5A:
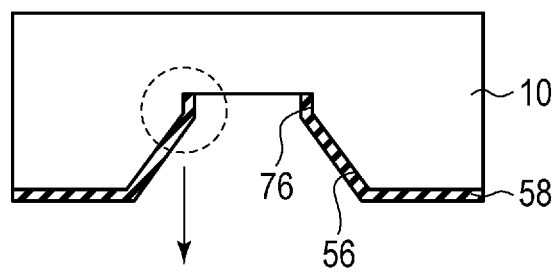
FIG. 5A, FIG. 5B, FIG. 5C, FIG. 5D, FIG. 5E, and FIG. 5F are views for illustrating effects of the method of manufacturing the semiconductor device according to the fourth embodiment of the present invention.
Figure 5D:
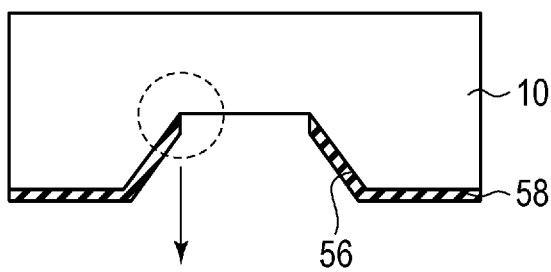
Figure 5B:
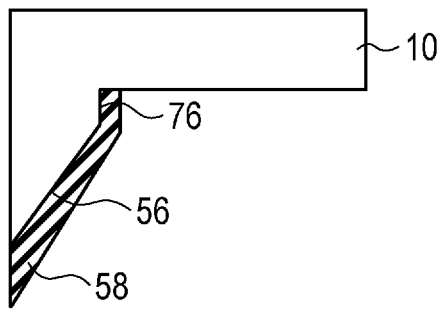
Figure 5E:
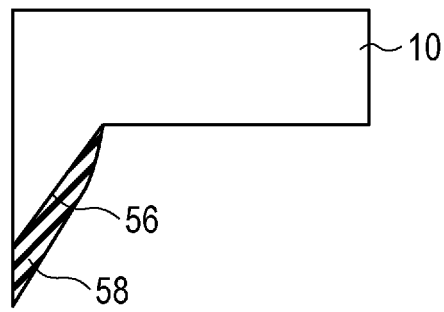
Figure 5C:
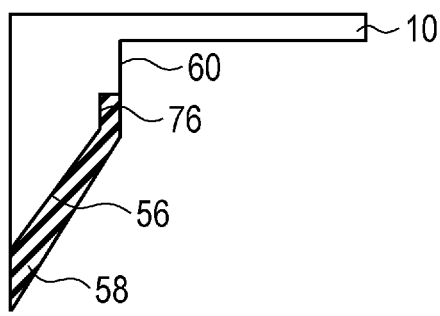
Figure 5F:
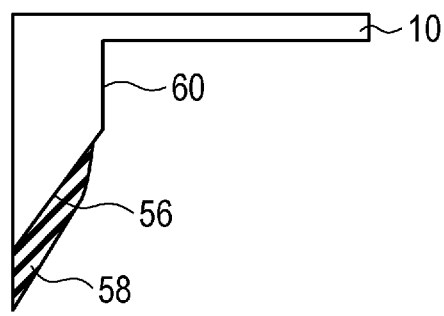

FIG. 5A to FIG. 5F are views for illustrating the effects of the semiconductor device manufacturing method according to the present embodiment in comparison to the semiconductor device manufacturing method according to the third embodiment. FIG. 5A and FIG. 5B are partial enlarged views corresponding to the step of FIG. 4D, and FIG. 5C is a partial enlarged view corresponding to the step of FIG. 4E. FIG. 5D, FIG. 5E, and FIG. 5F are partial enlarged views of steps of the third embodiment that correspond to FIG. 5A, FIG. 5B, and FIG. 5C, respectively.

In the present embodiment, the part 76 having a width that is constant in the depth direction is formed at the bottom of the part 56 as described above. Formation of the part 76 gives the mask film 58 vertically formed end surfaces (see FIG. 5B). The end portions of the mask film 58 formed in this manner have less chance of receding when the semiconductor substrate 10 is etched with the mask film 58 as a mask.

In the case where the part 76 is not provided at the bottom of the part 56, on the other hand, the end surface of the mask film 58 is likely to have a slanted shape as illustrated in FIG. 5E, and there is a chance that the end portions of the mask film 58 recede during etching for forming the part 60, thereby exposing the tapered surface of the part 56 in places. The tapered surface of the part 56 is etched in the exposed portions when the part 60 is formed by etching, which may cause the furrow-like hollow portion.

Through formation of the part 76 as in the present embodiment, the end surface of the mask film 58 may be formed vertically, which may prevent the receding of the mask film 58 and the resultant furrow-like hollow portion in the tapered surface of the part 56.

The depth T1 of the part 76 that gives the mask film 58 a vertical end surface is 1 µm or more. However, in the case where the part 76 is formed continuously without removing the mask film 66, there is a chance that the furrow-like hollow portion is generated when the tapered surface of the part 56 is etched in a space between the mask film 66 and the part 76. It is therefore preferred to minimize the depth of the part 76, and the preferred depth T1 of the part 76 is 10 μm or less. In short, the preferred depth of the part 76 is 1 μm or more and 10 μm or less.

According to the present embodiment, a drop in the performance of insulation between the through electrode and the semiconductor substrate may be prevented, and the resultant semiconductor device is high in yield and long-term reliability.

Modified Embodiments

The present invention is not limited to the embodiments described above, and may partially be modified or adjusted without departing from the spirit of the present invention.

For instance, the mask film 52, which is made of an insulating material and left to be utilized as an insulating member for insulation between the semiconductor substrate 10 and the through electrode 70 in the example described in the first embodiment, may instead be removed after the part 56 is formed and before the mask film 58 is formed.

While the through electrode 70 in the first embodiment is formed by electrolytic plating so as to fill the via-hole 64, the through electrode 70 does not always need to be formed so as to fill the via-hole 64. For instance, a film-shaped through electrode may be formed so as to stretch along the inner surface of the via-hole 64 and extends onto the surface of the semiconductor substrate 10. According to the present invention, discontinuity in the formed through electrode may be prevented in this case as well as in the case where the metal seed layer is formed.

All of the embodiments described above merely describe embodied examples for carrying out the present invention. Therefore, the technical scope of the present invention should not be read as restrictive by the embodiments described above. Specifically, the present invention may be carried out in various forms without departing from the technical ideas or main features of the present invention. Each term herein is used for the sole purpose of describing the present invention, and may encompass equivalents of what is referred to by the term. The present invention is not to be limited by the strict meaning of the term.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-164540, filed Aug. 25, 2016, which is hereby incorporated by reference herein in its entirety.

What is claimed is:

1. A semiconductor device comprising:
a semiconductor substrate having a first surface and a second surface opposite from the first surface, the semiconductor substrate being provided with a through-hole passing through the semiconductor substrate from the first surface to the second surface;
an electrode placed on a side of the second surface; and
a conductive member provided in the through-hole and connected to the electrode,
wherein the through-hole includes a first part and a second part, which is located at a portion closer to the second surface than the first part,
wherein the through-hole has a variable cross-section when taken parallel to the first surface, such that the first part has a tapered shape in which the variable cross-section decreases in width measured parallel to the first surface as a distance from the first surface increases,
wherein the first part has a side surface having a first inclination angle with respect to the first surface, and the second part has a side surface having a second inclination angle with respect to the first surface, which is larger than the first inclination angle,
wherein the semiconductor device is provided with a first insulating film arranged between the conductive member and the side surface of the first part, and between the conductive member and the side surface of the second part, and a second insulating film arranged between the first insulating film and the side surface of the first part, and
wherein the second insulating film does not cover at least a part of the side surface of the second part.

2. The semiconductor device according to claim 1, wherein the first insulating film and the second insulating film are extended over the first surface of the semiconductor substrate.

3. The semiconductor device according to claim 1, wherein the first insulating film and the second insulating film are made of insulating materials different from each other.

4. The semiconductor device according to claim 2, wherein the first insulating film and the second insulating film are made of insulating materials different from each other.

5. The semiconductor device according to claim 1, wherein the semiconductor device is provided with a third insulating film placed between the first surface of the semiconductor substrate and the second insulating film.

6. The semiconductor device according to claim 1, further comprising a semiconductor element provided on a side of the second first surface of the semiconductor substrate,
wherein the electrode is electrically connected to the semiconductor element.

7. A method of manufacturing the semiconductor device according to claim 1, the method comprising:
preparing the semiconductor substrate having the first surface and the second surface opposite from the first surface, the semiconductor substrate being provided with the electrode on the side of the second surface of the semiconductor substrate;
forming a first mask over the first surface of the semiconductor substrate;
forming, in a region of the semiconductor substrate corresponding to the electrode, the first part having the tapered shape by etching the semiconductor substrate with the first mask as a mask;
forming a second mask over the semiconductor substrate, the second mask covering at least the side surface of the first part and exposing a bottom surface of the first part;
forming the second part communicating with the first part and reaching the electrode by etching the semiconductor substrate with the second mask as a mask;
forming the first insulating film covering at least the side surface of the first part, with the second insulating film formed thereon, and the side surface of the second part; and
forming the conductive member connected to the electrode in the first part and the second part where the insulating film is formed.

8. The method according to claim 7, wherein before the second mask is formed, the bottom surface of the first part is etched with the first mask as a mask to dig the bottom surface of the first part, thereby forming, between the side surface of the first part and bottom surface of the first part, a side surface that has an inclination angle larger than the first inclination angle of the side surface of the first part.

9. The method according to claim 7, wherein the first part is formed by etching the semiconductor substrate under an etching condition that allows etching to progress also in a part of the semiconductor substrate covered with the first mask.

10. The method according to claim 7, wherein the semiconductor device is provided with an insulating layer placed between the semiconductor substrate and the electrode, and the second mask is made of an insulating material different from the insulating layer,
   wherein the second mask remains as the second insulating film between the side surface of the first part and the conductive member after the forming of the conductive member.

11. The method according to claim 7, wherein the second mask is made of an insulating material, and
   wherein the second mask remains as the second insulating film between the side surface of the first part and the conductive member after the forming of the conductive member.

12. The method according to claim 7, wherein the first mask is removed before the forming of the second mask.

13. The method according to claim 7, wherein the second mask is formed over a part of the first surface of the semiconductor substrate where the first mask is provided.

14. The method according to claim 7, wherein the second mask is formed by forming a film to be the second mask over the side surface of the first part and bottom surface of the first part, and then etching back the film to selectively remove the film from the bottom surface.

15. A semiconductor device comprising:
   a semiconductor substrate having a first surface and a second surface opposite from the first surface, the semiconductor substrate being provided with a through-hole passing through the semiconductor substrate from the first surface to the second surface;
   an electrode placed on a side of the second surface; and
   a conductive member provided in the through-hole and connected to the electrode,
   wherein the through-hole includes a first part, which has a forward tapered shape, and a second part, which is located at a portion closer to the second surface than the first part,
   wherein the first part has a side surface having a first inclination angle with respect to the first surface, and the second part has a side surface having a second inclination angle with respect to the first surface, which is larger than the first inclination angle,
   wherein the semiconductor device is provided with a first insulating film arranged between the conductive member and the side surface of the first part, and between the conductive member and the side surface of the second part, and a second insulating film arranged between the first insulating film and the side surface of the first part, and
   wherein the second insulating film does not cover at least a part of the side surface of the second part.

16. The semiconductor device according to claim 15, wherein the first insulating film and the second insulating film are extended over the first surface of the semiconductor substrate.

17. The semiconductor device according to claim 16, wherein the first insulating film and the second insulating film are made of insulating materials different from each other.

18. The semiconductor device according to claim 15, wherein the first insulating film and the second insulating film are made of insulating materials different from each other.

19. The semiconductor device according to claim 15, wherein the semiconductor device is provided with a third insulating film placed between the first surface of the semiconductor substrate and the second insulating film.

20. The semiconductor device according to claim 15, further comprising a semiconductor element provided on the side of the second surface of the semiconductor substrate,
   wherein the electrode is electrically connected to the semiconductor element.

* * * * *